(12) United States Patent
Hsin

(10) Patent No.: US 6,740,973 B1
(45) Date of Patent: May 25, 2004

(54) STACKED STRUCTURE FOR AN IMAGE SENSOR

(75) Inventor: Chung Hsien Hsin, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/340,361

(22) Filed: Jan. 9, 2003

(51) Int. Cl.⁷ .................. H01L 31/0232; H01L 23/52
(52) U.S. Cl. .................. 257/749; 257/684; 257/778; 257/432
(58) Field of Search ................ 257/684, 777, 257/723, 685, 686, 749, 778, 432

(56) References Cited

U.S. PATENT DOCUMENTS

| | | | |
|---|---|---|---|
| 5,211,762 A | * | 5/1993 | Isoda et al. ............... 257/40 |
| 5,952,714 A | * | 9/1999 | Sano et al. ............... 257/680 |
| 6,130,448 A | * | 10/2000 | Bauer et al. ............. 257/222 |
| 6,297,540 B1 | * | 10/2001 | Assadi et al. ............ 257/432 |
| 6,396,116 B1 | * | 5/2002 | Kelly et al. ............. 257/432 |
| 6,455,774 B1 | * | 9/2002 | Webster ................. 174/52.4 |
| 6,531,341 B1 | * | 3/2003 | Peterson et al. ........... 438/123 |
| 6,545,332 B2 | * | 4/2003 | Huang .................. 257/433 |
| 6,590,269 B1 | * | 7/2003 | Chuang et al. ........... 257/432 |
| 2002/0096753 A1 | * | 7/2002 | Tu et al. ................ 257/680 |

FOREIGN PATENT DOCUMENTS

| | | | | |
|---|---|---|---|---|
| FR | WO 02/075815 A1 | * | 9/2002 | |
| JP | 2-126685 | * | 5/1990 | ............ 257/738 |

* cited by examiner

Primary Examiner—Jasmine Clark
(74) Attorney, Agent, or Firm—Pro-Techtor International Services

(57) ABSTRACT

An image sensor, which is electrically connected to a printed circuit board. The image sensor includes a transparent glass layer on which signal input terminals and signal output terminals are formed, a photosensitive chip on which bonding pads are formed, a substrate, and an integrated circuit. Each bonding pad is formed with a projection, and the photosensitive chip is electrically connected to the signal input terminals through the projections. The substrate has a first surface, a second surface, and a first through hole penetrating through the substrate from the first surface to the second surface. The signal output terminals are electrically connected to the first surface of the substrate with the photosensitive chip positioned within the first through hole. The second surface is electrically connected to the printed circuit board. The integrated circuit is electrically connected to the second surface of the substrate.

6 Claims, 1 Drawing Sheet

STACKED STRUCTURE FOR AN IMAGE SENSOR

BACKGROUND OF THE INVENTION

1. Field of the Invention

The invention relates to a stacked structure for an image sensor, and more particularly to a stacked structure in which a photosensitive chip and integrated circuits with different functions may be integrally packaged.

2. Description of the Related Art

A general sensor is used for sensing signals that may be image signals or audio signals. The sensor of the invention is used to receive image (optical) signals and convert the image signals into electrical signals that are to be transmitted to the printed circuit board.

The image sensor is further electrically connected to other packaged integrated circuits in order to possess various functions. For example, the image sensor may be electrically connected to a digital signal processor which is used to process the signals generated by the image sensor. Furthermore, the image sensor may be electrically connected to a micro controller or a central processing unit to possess various functions.

However, a conventional image sensor is individually packaged. Thus, various integrated circuits mating with the image sensor have to be individually packaged with the image sensor. The packaged image sensor and various signal processing units are then electrically connected to the printed circuit board via a plurality of wires. In this structure, a substrate and a package body have to be used when each of the signal processing units and the image sensor are individually packaged, thereby increasing the manufacturing costs. Furthermore, when each of the signal processing units is mounted to the printed circuit board, the required area of the printed circuit board is relatively large. Thus, the products cannot be made thin, small, and light.

Referring to FIG. 1, a conventional stacked structure for an image sensor includes a substrate 10 having a first surface 12 and a second surface 14. Signal input terminals 15 are formed on the first surface 12, and signal output terminals 16, which are to be electrically connected to a printed circuit board 17, are formed on the second surface 14. The image sensor also includes a frame layer 18, a photosensitive chip 26, a plurality of wires 28, a transparent layer 34, and an integrated circuit 19. The frame layer 18 has an upper surface 20 and a lower surface 22, which is adhered to the first surface 12 of the substrate 10 to form a cavity 24 together with the substrate 10. The photosensitive chip 26 is placed within the cavity 24 formed by the substrate 10 and the frame layer 18, and is mounted to the first surface 12 of the substrate 10. Each of the wires 28 has a first terminal 30 electrically connected to the photosensitive chip 26, and a second terminal 32 electrically connected to a corresponding signal input terminal 15 of the substrate 10. The transparent layer 34 is placed on the upper surface 20 of the frame layer 18. The integrated circuit 19 is mounted to the second surface 14 of the substrate 10.

According to the above-mentioned structure, the overall volume of the image sensor is large, and the image sensor cannot be miniaturized.

SUMMARY OF THE INVENTION

It is therefore an object of the invention to provide a stacked structure for an image sensor, in which the number of package members may be decreased and the package cost may be lowered.

Another object of the invention is to provide a stacked structure for an image sensor, which is capable of simplifying and facilitating the manufacturing processes.

Still another object of the invention is to provide a stacked structure for an image sensor, in which the area of the image sensor may be reduced.

Yet still another object of the invention is to provide a stacked structure for an image sensor, which can be miniaturized and made more practical in use.

To achieve the above-mentioned objects, the invention provides an image sensor, which is to be electrically connected to a printed circuit board. The image sensor includes a transparent glass layer on which a plurality of signal input terminals and signal output terminals are formed, a photosensitive chip on which a plurality of bonding pads is formed, a substrate, and an integrated circuit. Each of the bonding pads is formed with a projection, and the photosensitive chip is electrically connected to the signal input terminals on the transparent glass layer through the projections. The substrate has a first surface, a second surface, and a first through hole penetrating through the substrate from the first surface to the second surface. The signal output terminals of the transparent glass layer are electrically connected to the first surface of the substrate with the photosensitive chip positioned within the first through hole of the substrate. The second surface is electrically connected to the printed circuit board. The integrated circuit is electrically connected to the second surface of the substrate.

According to above-mentioned structure, the above-mentioned objects can be achieved.

DETAILED DESCRIPTION OF THE INVENTION

Figure 1:
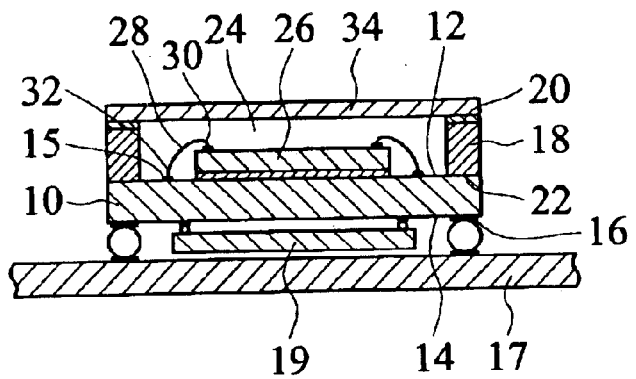
FIG. 1 is a cross-sectional view showing a conventional image sensor.
Figure 2:
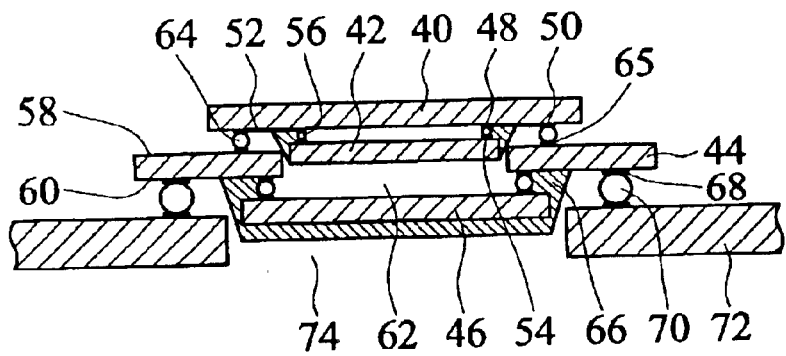
FIG. 2 is a cross-sectional view showing an image sensor according to a first embodiment of the invention.

Referring to FIG. 2, a stacked structure for an image sensor according to a first embodiment of the invention includes a transparent glass layer 40, a photosensitive chip 42, a substrate 44 and an integrated circuit 46.

The transparent glass layer 40 is formed with a plurality of signal input terminals 48 and signal output terminals 50. The signal input terminals 48 are electrically connected to the signal output terminals 50, respectively, by wires 52 formed on a surface of the transparent glass layer 40.

The photosensitive chip 42 is formed with a plurality of bonding pads 54, each of which is formed with a projection 56. The photosensitive chip 42 is electrically connected to the signal input terminals 48 of the transparent glass layer 40 through the projections 56. The photosensitive chip 42 may receive optical signals passing through the transparent glass layer 40.

The substrate 44 has a first surface 58, a second surface 60 and a first through hole 62 penetrating through the substrate 44 from the first surface 58 to the second surface 60. Each of the signal output terminals 50 of the transparent glass layer 40 is formed with a metallic ball 64 for electrically connecting the signal output terminals 50 of the transparent glass layer 40 to first connection points 65 formed on the first surface 58 of the substrate 44, respectively. The photosensitive chip 42 is positioned within the first through hole 62 of the substrate 44. Since the photosensitive chip 42 is located within the first through hole 62 of the substrate 44, the volume of the image sensor may be effectively reduced.

In this embodiment, the integrated circuit 46 is a signal processor, which is electrically connected to the second surface 60 of the substrate 44 in a flip chip manner, and is encapsulated by a glue layer 66.

The second surface 60 of the substrate 44 is formed with second connection points 68 connected to the first connection points 65 on the first surface 58, respectively. The second connection points 68 are formed with BGA (Ball Grid Array) metallic balls 70, which are electrically connected to a printed circuit board 72. The printed circuit board 72 is formed with a second through hole 74 for accommodating the integrated circuit 46. Therefore, the volume of the image sensor may be further reduced.

Figure 3:
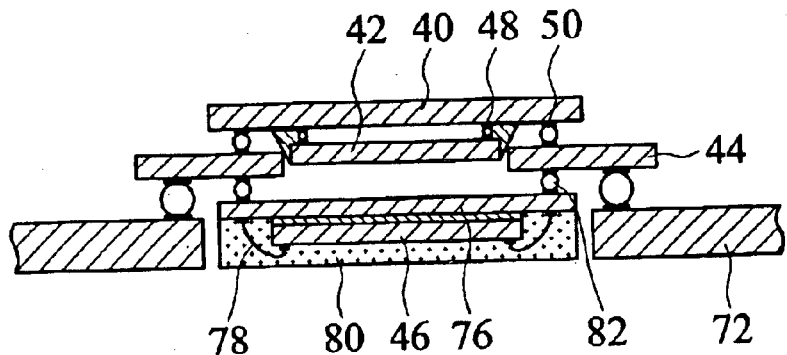
FIG. 3 is a cross-sectional view showing an image sensor according to a second embodiment of the invention.

Please referring to FIG. 3, which shows an image sensor according to a second embodiment of the invention. The integrated circuit 46 is formed into a package body. In order to form the package body, the integrated circuit 46 is placed on a base plate 76, and wires 78 are provided to electrically connect the integrated circuit 46 to the base plate 76. Then, a glue layer 80 is provided to encapsulate the integrated circuit 46 and wires 78. Next, the base plate 76 is electrically connected to the second surface 60 of the substrate 44 through metallic balls 82.

According to the above-mentioned structure, the stacked structure for the image sensor of the invention has the following advantages.

1. Since the substrate 44 is formed with a first through hole 62 to accommodate the photosensitive chip 42 and the integrated circuit 46 is mounted to the second surface 60 of the substrate 44, the package volume of the image sensor may be reduced.

2. Since the printed circuit board 72 is formed with a second through hole 74 to accommodate the integrated circuit 46, the volume of the image sensor may be reduced.

3. Since the transparent glass layer 40 is formed with a plurality of signal input terminals 48 and signal output terminals 50, the photosensitive chip 42 may be electrically connected to the signal input terminals 48 of the transparent glass layer without forming a conventional frame layer to support the transparent glass layer. Hence, the number of package members may be decreased, the manufacturing processes are convenient, and the cost may be decreased.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An image sensor to be electrically connected to a printed circuit board, the image sensor comprising:

a transparent glass layer on which a plurality of signal input terminals and signal output terminals are formed;

a photosensitive chip on which a plurality of bonding pads is formed, each of the bonding pads being formed with a projection, and the photosensitive chip being electrically connected to the signal input terminals on the transparent glass layer through the projections;

a substrate having a first surface, a second surface, and a first through hole penetrating through the substrate from the first surface to the second surface, the signal output terminals of the transparent glass layer being electrically connected to the first surface of the substrate with the photosensitive chip positioned within the first through hole of the substrate, and the second surface being electrically connected to the printed circuit board; and an integrated circuit electrically connected to the second surface of the substrate.

2. The image sensor according to claim 1, wherein the signal output terminals of the transparent glass layer are formed with metallic balls, which are electrically connected to the substrate.

3. The image sensor according to claim 1, wherein the integrated circuit is electrically connected to the second surface of the substrate in a flip chip manner.

4. The image sensor according to claim 1, wherein the integrated circuit is formed into a package body, which is electrically connected to the second surface of the substrate.

5. The image sensor according to claim 1, wherein the integrated circuit is a signal processor.

6. The image sensor according to claim 1, wherein the printed circuit board is formed with a second through hole, and the integrated circuit is located within the second through hole when the substrate is electrically connected to the printed circuit board.

* * * * *